United States Patent
Tanaka et al.

(10) Patent No.: US 9,067,407 B2
(45) Date of Patent: Jun. 30, 2015

(54) SCREEN PRINTING METHOD AND DEVICE INCLUDING A CLOSED SQUEEGEE MECHANISM AND A PASTE DEPOSITION MECHANISM

(75) Inventors: Tetsuya Tanaka, Yamanashi (JP); Yuuji Ootake, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/985,634

(22) PCT Filed: Mar. 2, 2012

(86) PCT No.: PCT/JP2012/001453
§ 371 (c)(1),
(2), (4) Date: Aug. 15, 2013

(87) PCT Pub. No.: WO2012/120860
PCT Pub. Date: Sep. 13, 2012

(65) Prior Publication Data
US 2013/0319265 A1    Dec. 5, 2013

(30) Foreign Application Priority Data
Mar. 9, 2011  (JP) .................................. 2011-051197

(51) Int. Cl.
*B41F 15/44*    (2006.01)
*B41F 15/08*    (2006.01)
(Continued)

(52) U.S. Cl.
CPC .............. *B41F 15/44* (2013.01); *B41F 15/0818* (2013.01); *B41P 2215/50* (2013.01);
(Continued)

(58) Field of Classification Search
CPC .... B41F 15/0818; B41F 15/085; B41F 15/42; B41F 15/44; B41F 15/46; B41F 15/26; B41F 15/423; H05K 3/1233; B41M 1/12
USPC ......................................... 101/123, 126, 129
See application file for complete search history.

(56) References Cited

U.S. PATENT DOCUMENTS 5,070,782 A * 12/1991 Sakai et al. ................... 101/123
5,287,806 A    2/1994 Nanzai
(Continued)

FOREIGN PATENT DOCUMENTS

| JP | 04-014451 A | 1/1992 |
| JP | 08-099402 A | 4/1996 |
| JP | 2001-347636 A | 12/2001 |
| JP | 2006-272584 A | 10/2006 |

OTHER PUBLICATIONS

International Search Report for PCT/JP2012/001453 dated Apr. 17, 2012.

*Primary Examiner* — Leslie J Evanisko
(74) *Attorney, Agent, or Firm* — Pearne & Gordon LLP

(57) ABSTRACT

In a returning path operation for moving a closed type squeegee mechanism in a direction opposite to a squeezing direction after an outward path operation where paste is packed into pattern holes by moving the closed type squeegee mechanism in the squeezing direction, the paste supplied to the outside of the closed type squeegee mechanism on an upper surface of a mask is spread due to a deposition member, by moving the deposition member of a paste deposition mechanism in a state close to an upper surface of the mask in the direction opposite to the squeezing direction. Therefore, a paste film having a predetermined thickness is formed.

2 Claims, 7 Drawing Sheets

(51) Int. Cl.
  *H05K 3/12* (2006.01)
  *B41F 15/26* (2006.01)
  *B41F 15/42* (2006.01)
  *B41M 1/12* (2006.01)

(52) U.S. Cl.
  CPC .......... *H05K3/1233* (2013.01); *B41F 15/0881* (2013.01); *B41F 15/26* (2013.01); *B41F 15/423* (2013.01); *B41M 1/12* (2013.01)

(56) References Cited

U.S. PATENT DOCUMENTS

| | | | | |
|---|---|---|---|---|
| 5,947,022 | A * | 9/1999 | Freeman et al. | 101/123 |
| 6,591,745 | B2 * | 7/2003 | Miyahara et al. | 101/123 |
| 6,820,544 | B2 * | 11/2004 | Miyahara et al. | 101/123 |
| 8,561,535 | B2 * | 10/2013 | Sabia et al. | 101/129 |

* cited by examiner

SCREEN PRINTING METHOD AND DEVICE INCLUDING A CLOSED SQUEEGEE MECHANISM AND A PASTE DEPOSITION MECHANISM

TECHNICAL FIELD

The present invention relates to a screen printing device and a screen printing method for printing paste used for part joining, circuit forming or the like on a substrate.

BACKGROUND ART

A screen printing has been known as a method for supplying paste used for part joining, circuit forming or the like on a substrate. According to the method, the paste is printed on an electrode plane of a substrate via pattern holes provided on a screen mask. For carrying out the method, a screen printing device provided with a screen printing mechanism in which a squeegee unit slides on an upper surface of the screen mask in a state of abutting the substrate on a lower surface of the screen mask has been used (see PTL 1, for example).

In an example shown in PTL 1, a closed type squeegee mechanism has been used as a squeegee unit. The closed type squeegee mechanism is configured so that a cartridge storing paste is mounted therein, and the paste is packed into pattern holes by a compression force produced by compressing the paste in the cartridge. Upon comparison with a simple squeezing operation of filling paste into pattern holes by moving a squeegee, which is performed by a conventional open-type squeegee, the closed type squeegee mechanism described above has an excellent packing property. Therefore, in this case, a mesh mask which is formed by sealing a metallic mesh material with resin may be suitably used as a screen mask for printing, for example, where the mesh mask is difficult to expect a favorable packing property in the case of the conventional squeegee.

CITATION LIST

Patent Literature

[PTL 1] JP-A-2006-272584

SUMMARY OF INVENTION

Technical Problem

However, in the case of a screen printing with respect to the mesh mask described above, disadvantages to be described below have been caused due to properties of the mesh mask. That is, when a screen printing device using a closed type squeegee mechanism performs a squeezing operation, paste on an upper surface of the mesh mask is scraped by a sliding member on a following side. Therefore, the paste packed into pattern holes of the mesh mask is completely exposed after squeezing is finished. Thus, the paste in the mesh is rapidly dried by being exposed to the air, so that it is easy to be in a clogging state. If the screen printing work is continuously performed in a state described above, disadvantages are caused in a plate-removing process where the paste is separated from the pattern holes, or a packing property of the paste is deteriorated in succeeding printing. As a result, a printing failure is caused. As described above, in a conventional screen printing with respect to a mesh mask, there is a problem in that it is difficult to prevent a printing failure caused by drying of paste in pattern holes.

Therefore, an object of the invention is to provide a screen printing device and a screen printing method capable of preventing a printing failure caused by drying of paste in pattern holes.

Solution to Problem

A screen printing device according to one aspect of the invention is a screen printing device for printing paste on a substrate via pattern holes by performing a squeezing operation in which a squeegee unit slides in a squeezing direction in a state of abutting on an upper surface of a mesh mask formed with the pattern holes, including:

a substrate underlaid bracket portion which receives and holds the substrate;

a squeegee moving mechanism which causes the squeegee unit to be moved upward or downward and moved in the squeezing direction; and a paste deposition mechanism which is movable in the squeezing direction in synchronization with the squeegee unit and has a deposition member moving upward or downward with respect to the mesh mask provided on a front side in the squeezing direction of the squeezing unit, wherein the squeegee unit is a closed type squeegee mechanism which is configured so that a pair of sliding members opposed to each other in a downward-narrowed state extend downward from a lower surface side of a main body portion storing the paste so as to align a facing direction thereof with the squeezing direction and compresses the paste stored in the main body portion and slides the sliding member in the squeezing direction in a state of being abutted on the upper surface of the mesh mask so that the paste is packed into the pattern holes via a printing opening provided between the sliding members, wherein, in an outward path operation for moving the squeegee unit in the squeezing direction, a first sliding member positioned on a leading side of the squeezing direction between the pair of sliding members is moved in the squeezing direction before the packing of the paste into the pattern holes via the printing opening so that the paste supplied to the outside of the closed type squeegee mechanism on the upper surface of the mesh mask is packed into the pattern holes, and wherein, in a returning path operation for moving the squeegee unit in a direction opposite to the squeezing direction after the outward path operation, the paste supplied to the outside of the closed type squeegee mechanism on the upper surface of the mesh mask is spread due to the deposition member, by moving the deposition member in a state close to the upper surface of the mesh mask in the direction opposite to the squeezing direction, thereby forming a paste film having a predetermined thickness.

A screen printing method according to one aspect of the invention is a screen printing method for printing paste on a substrate via pattern holes by performing a squeezing operation in which a squeegee unit slides in a squeezing direction in a state of abutting on an upper surface of a mesh mask formed with the pattern holes, in which the squeegee unit is a closed type squeegee mechanism which is configured so that a pair of sliding members opposed to each other in a downward-narrowed state extend downward from a lower surface side of a main body portion storing the paste so as to align a facing direction thereof with the squeezing direction and compresses the paste stored in the main body portion and slides the sliding member in the squeezing direction in a state of being abutted on the upper surface of the mesh mask so that the paste is packed into the pattern holes via a printing opening provided between the sliding members, and further a paste deposition mechanism which is movable in the squeezing direction in synchronization with the squeegee unit and has a deposition member moving upward or downward with respect to the mesh mask is additionally provided on a front side in the squeezing direction of the squeezing unit is provided, the method including:

a substrate positioning step which positions the substrate received and held by a substrate underlaid bracket portion, with respect to the mesh mask;

a paste supplying step which supplies the paste to the outside of the closed type squeegee mechanism on the upper surface of the mesh mask; and a printing executing step which reciprocatively slides the squeegee unit on the upper surface of the mesh mask, wherein, in an outward path operation of the printing executing step for moving the squeegee unit in the squeezing direction, a first sliding member positioned on a leading side of the squeezing direction between the pair of sliding members is moved in the squeezing direction before the packing of the paste into the pattern holes via the printing opening so that the paste supplied to the outside of the closed type squeegee mechanism on the upper surface of the mesh mask is packed into the pattern holes, and wherein, in a returning path operation for moving the squeegee unit in a direction opposite to the squeezing direction after the outward path operation, the paste supplied to the outside of the closed type squeegee mechanism on the upper surface of the mesh mask is spread due to the deposition member, by moving the deposition member in a state close to the upper surface of the mesh mask in the direction opposite to the squeezing direction, and thereby forming a paste film having a predetermined thickness.

Advantageous Effects of Invention

According to the invention, in a returning path operation of a printing executing step for moving a squeegee unit in a direction opposite to a squeezing direction after an outward path operation where paste is packed into pattern holes by moving the squeegee unit in the squeezing direction, the paste supplied to the outside of a closed type squeegee mechanism on an upper surface of a mesh mask is spread due to a deposition member, by moving the deposition member of a paste deposition mechanism in a state close to an upper surface of the mesh mask in the direction opposite to the squeezing direction. Therefore, a paste film having a predetermined thickness is formed. Thus, it is possible to cover the pattern holes by the paste film, thereby preventing a printing failure caused by drying of the paste in the pattern holes.

DESCRIPTION OF EMBODIMENTS

Next, an embodiment of the invention will be described with reference to drawings. First, a structure of a screen printing device 1 will be described. The screen printing device 1 has a function for printing paste used for solder jointing or circuit forming on a substrate via pattern holes by performing a squeezing operation in which a squeegee unit is slid in a squeezing direction in a state of abutting on an upper surface of a mesh mask formed with the pattern hole.

Figure 1:
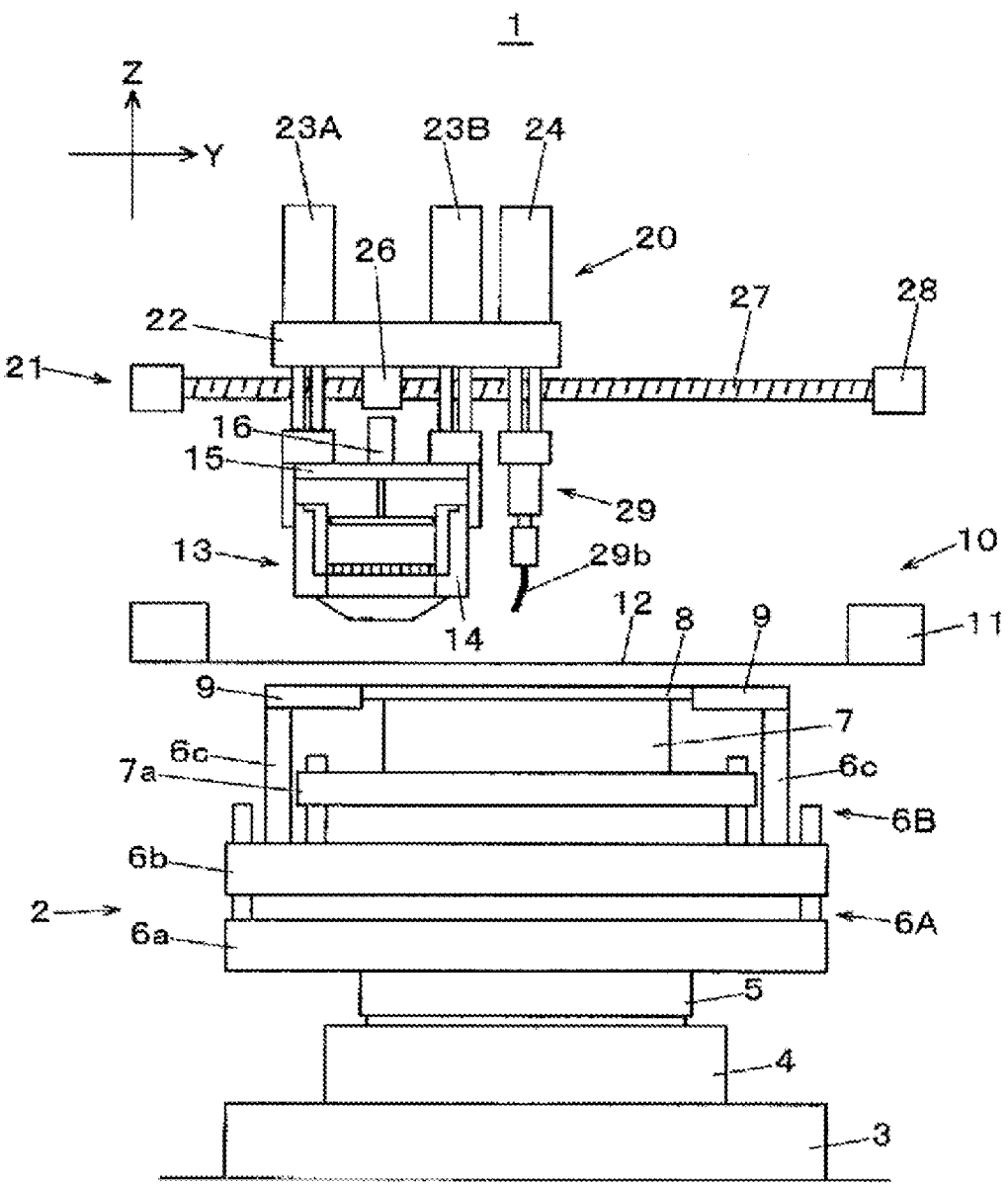
FIG. 1 is a side view of a screen printing device according to an embodiment of the invention.
Figure 2:
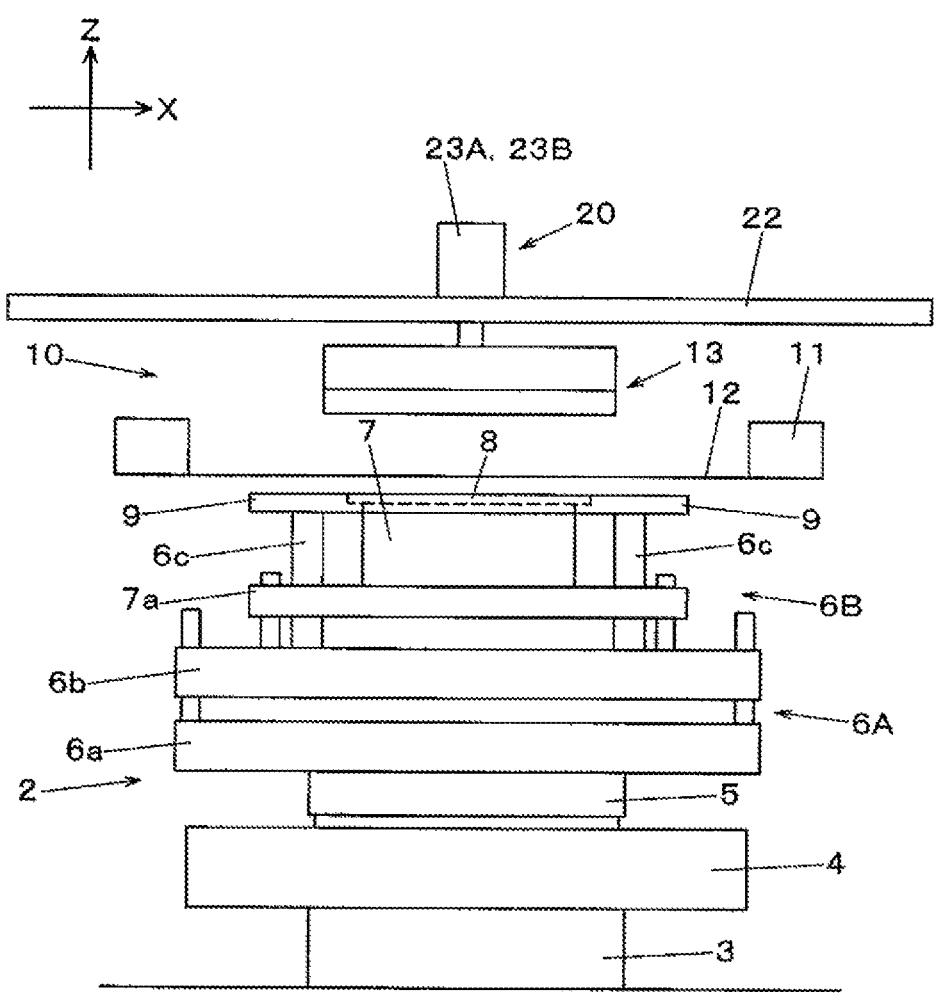
FIG. 2 is a front view of the screen printing device according to the embodiment of the invention.

In FIGS. 1 and 2, a screen printing portion 10 is installed on an upper side of a substrate positioning portion 2 of the screen printing device 1. The substrate positioning portion 2 is configured that a O-axis table 5 is superimposed on a moving table constituted by a Y-axis table 3 and an X-axis table 4, and a first Z-axis table 6A and a second Z-axis table 6B are installed thereon, and further a substrate underlaid bracket portion 7 is installed on the second Z-axis table 6B. The first Z-axis table 6A is fixed to an upper surface of the O-axis table 5. A lifting base 6b is moved upward or downward with respect to a fixing base 6a by driving the first Z-axis table 6A.

In addition, by driving the second Z-axis table 6B, an underlaid base 7a and the substrate underlaid bracket portion 7 are moved upward or downward with respect to the lifting base 6b. The substrate underlaid bracket portion 7 receives and holds a substrate 8, as a printing object, which is transported from an upstream-side device in an X direction by a substrate transporting mechanism (not shown). In the lifting base 6b, a pair of clamp members 9 are held via a bracket 6c. The clamp members 9 are opened and closed in a Y direction by an open and close driving mechanism (not shown). In a closed state, the clamp members 9 clamp-fixes the substrate 8, which is received by the substrate underlaid bracket portion 7, by interposing the substrate 8 from both sides thereof.

The screen printing portion 10 installed on the upper side of the substrate positioning portion 2 is configured by mounting, as a screen mask, a mesh mask 12 having a mesh portion 12b on a holder 11. The mesh portion 12b is formed by weaving a metallic thin wire. Pattern holes 12a (see FIG. 3) are opened on the mesh mask 12 so as to correspond to printing sections of the substrate 8 as a printing object. A squeegee unit for performing the squeezing operation on the mesh mask 12 and a paste deposition mechanism 29 are installed on an upper side of the screen printing portion 10 so as to be integrally freely moved by a squeegee moving mechanism 20. In this case, a closed type squeegee mechanism 13 is used as a squeegee unit.

The closed type squeegee mechanism 13 is provided with a printing portion 14 held by a connecting member 15, 15a. The closed type squeegee mechanism 13 is configured that paste P stored in the printing portion 14 is compressed by a cylinder 16 and packed into the pattern holes 12a (see FIG. 3). The paste deposition mechanism 29 has a function to form a coating film of the paste P which covers an upper surface of the mesh mask 12. Further, the paste deposition mechanism 29 is configured that a deposition member 29b is provided on a leading side (a right side in the Y direction, in this case) in the squeezing direction of the closed type squeegee mechanism 13 so as to be movable in the squeezing direction in synchronization with the closed type squeegee mechanism 13 and moved upward or downward with respect the mesh mask 12. A paste film P* having a predetermined thickness is formed on the upper surface of the mesh mask 12 by supplying the paste P on the upper surface of the mesh mask 12 and horizontally moving the paste deposition mechanism 29 in a state where the deposition member 29b maintains a predetermined gap with respect to the upper surface of the mesh mask 12 (see FIGS. 6A to 6C).

Figure 3:
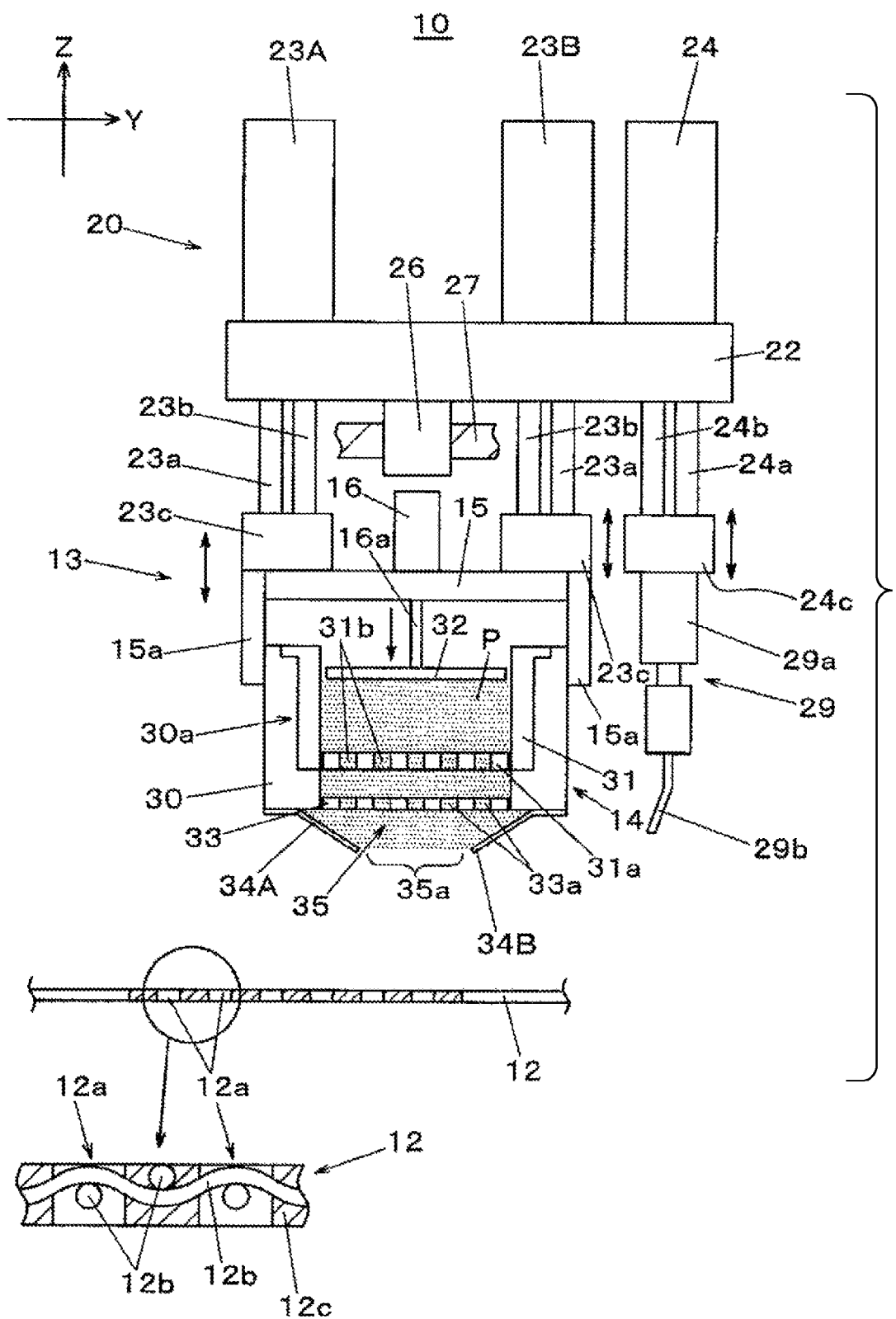
FIG. 3 is a partial cross-sectional side view of the screen printing device according to the embodiment of the invention.

Subsequently, the configurations of the squeegee moving mechanism 20, the closed type squeegee mechanism 13 and the paste deposition mechanism 29 will be described with reference to FIG. 3. The squeegee moving mechanism 20 is equipped with a Y-axis moving mechanism 21 for moving a moving plate 22 in the Y direction, squeegee lifting mechanisms 23A and 23B provided on the upper surface of the moving plate 22, and a deposition mechanism lifting mechanism 24 for moving the paste deposition mechanism 29 upward or downward. The squeegee lifting mechanisms 23A and 23B and the deposition mechanism lifting mechanism 24 are respectively provided with lifting actuators. A lifting shaft 23a and a lifting shaft 24a respectively extend on lower sides of the squeegee lifting mechanisms 23A and 23B and the deposition mechanism lifting mechanism 24. The lifting shaft 23a and the lifting shaft 24a are respectively moved upward or downward in a state of being guided by a guide shaft 23b and a guide shaft 24b. The closed type squeegee mechanism 13 is connected to a lower end portion of the lifting shaft 23a via a lifting block 23c and a connecting member 15, 15a. Further, the deposition member 29b having a squeegee shape held by a holder 29a is connected to a lower end portion of the lifting shaft 24a via lifting block 24c.

The closed type squeegee mechanism 13 is moved upward or downward with respect to the mesh mask 12 by driving the squeegee lifting mechanisms 23A and 23B. Therefore, the squeegee lifting mechanisms 23A and 23B and the Y-axis moving mechanism 21 function as a squeegee moving mechanism for moving the closed type squeegee mechanism 13 upward or downward and moving it in the squeezing direction. In addition, the deposition member 29b is moved upward or downward with respect to the mesh mask 12 by driving the deposition mechanism lifting mechanism 24.

A function of the paste deposition mechanism 29 will be described. In a state where the paste P is supplied on the upper surface of the mesh mask 12, the deposition member 29b is moved close to a position where a predetermined deposition gap is maintained with respect to the upper surface of the mesh mask 12, and then the paste deposition mechanism 29 is horizontally moved. Thereby, the paste film P* (see FIGS. 7A to 7C) which is formed by spreading the paste P using the deposition member 29b and has a predetermined thickness is formed on the upper surface of the mesh mask 12. The paste film P* has a function of preventing the progress of drying of the paste P in the pattern holes 12a, by covering the upper surface side of the pattern holes 12a packed with the paste P in the squeezing operation. Therefore, it is possible to prevent clogging in the pattern holes 12a, caused by the paste P.

Hereinafter, the mesh mask 12 used in the embodiment will be described. As shown in an enlarged view of FIG. 3, the mesh mask 12 is configured that the entire range of the mesh portion 12b formed by weaving a metallic thin wire is sealed with a sealing resin 12c, except the range of the pattern holes 12a. The mesh mask described above is used in the case where it is difficult to use, as a screen mask, a conventional metal mask which is made of a metal plate in order to provide linear-shaped pattern holes in which a printing pattern for performing printing for a circuit-forming or the like is continuously formed.

When screen printing is carried out using the mesh mask, the mesh portion 12b is also present in the pattern hole 12a. Therefore, there is a packing-property related problem in that it is difficult to completely fill the paste P into the pattern holes 12a. In addition, upon comparison with a metal mask, the mesh mask has a strength property that the elasticity thereof is great in an in-plane direction and the flexural rigidity thereof is small. Therefore, the mesh mask 12 is suitable for off-contact printing in which only a part of the mesh mask 12 pushed by the closed type squeegee mechanism 13 is abutted on the substrate 8, without causing the entire mesh mask 12 to be brought into contact with the upper surface of the substrate 8 in the squeezing operation by the closed type squeegee mechanism 13.

A configuration of the Y-axis moving mechanism 21 will be described. A nut member 26 is connected to the lower surface of the moving plate 22. A feeding screw 27 screwed into the nut member 26 is rotationally driven by a motor 28. The moving plate 22 is horizontally moved by driving the motor 28, whereby the closed type squeegee mechanism 13 connected to the squeegee lifting mechanisms 23A and 23B and the paste deposition mechanism 29 connected to the deposition mechanism lifting mechanism 24 are also horizontally moved. In a state where the closed type squeegee mechanism 13 is moved downward, the closed type squeegee mechanism 13 is horizontally moved on the mesh mask 12, by driving the motor 28. In other words, the motor 28, the feeding screw 27 and the nut member 26 constitute the Y-axis moving mechanism 21 for horizontally moving the closed type squeegee mechanism 13 on the mesh mask 12.

The printing portion 14 which packs the paste P into the pattern holes 12a, in a state of abutting on a surface of the mesh mask 12, is provided on the lower portion of the closed type squeegee mechanism 13. A main body portion 30 constituting the printing portion 14 is a block-shaped member having an elongated shape in a width direction of the mesh mask 12. The length of the main body portion 30 is set so as to cover the width of the substrate 8 as a printing object. A concave portion 30a is formed on the main body portion 30 such that a cartridge 31 storing the paste P is detachably mounted thereto.

The predetermined amount of paste P is stored in the cartridge 31 in advance, and the cartridge 31 is mounted on the main body portion 30 when performing printing. A compressing plate 32 for compressing the paste P in the inner portion is fit in the opening on the upper surface of the cartridge 31. The compressing plate 32 is connected to a rod 16a of the cylinder 16 disposed on the upper side thereof. The compressing plate 32 is reciprocatively moved in the cartridge 31 by driving the cylinder 16. By driving the cylinder 16 at a predetermined pressure, the paste P in the cartridge 31 is pushed downward at a predetermined pressure by the compressing plate 32.

A bottom surface of the cartridge 31 is an extruding plate 31a with respect to the paste P, and a plurality of openings 31b are provided on the extruding plate 31a. A diaphragm plate 33 mounted on the bottom portion of the main body portion 30 is disposed on the lower side of the extruding plate 31a. As similar to the extruding plate 31a of the cartridge 31, a plurality of openings 33a are provided on the diaphragm plate 33. A pair of sliding members 34A and 34B opposed to each other in a downward-narrowed state extend downward from a lower surface side of the main body portion 30 storing the paste P, in a state of aligning a facing direction thereof with the squeezing direction. A space surrounded by two pieces of sliding members 34A and 34B and the lower surface of the main body portion 30 constitutes a printing space 35 for accommodating the paste P. An opening portion between two pieces of sliding members 34A and 34B forms a printing opening 35a which carries out printing by packing the compressed paste P into the pattern holes 12a of the mesh mask 12.

The paste P in the cartridge 31 is compressed by being pressed downward by the cylinder 16. Then, the paste P passes through the opening 31b of the extruding plate 31a and the opening 33a of the diaphragm plate 33 and is extruded downward in a squeezed state. Since the paste P is squeezed as described above, the viscosity of the paste P is lowered so that the property thereof is modified to be suitable for screen printing. Then, the extruded paste P reaches the printing space 35 surrounded by the pair of sliding members 34A and 34B facing each other and the lower surface of the main body portion 30.

The sliding members 34A and 34B are plate-shaped members having flexibility and form leading and following walls of the printing space 35 in the squeezing direction. In a state where the closed type squeegee mechanism 13 is moved downward, the lower end portions of the sliding members 34A and 34B abut on the upper surface of the mesh mask 12. In the printing operation, the paste P stored in the cartridge 31 in the main body portion 30 is compressed while the sliding members 34A and 34B are slid in the squeezing direction in a state of abutting on the upper surface of the mesh mask 12. Therefore, the paste P is packed into the pattern holes 12a via the printing opening 35a formed between the sliding members 34A and 34B.

The paste P is sequentially packed into each of the pattern holes 12a by moving the closed type squeegee mechanism 13. If the paste P is packed into all of the pattern holes 12a, the substrate 8 is moved downward held by the substrate underlaid bracket portion 7, by driving the first Z-axis table 6A. Therefore, the screen printing of the paste P is completed with respect to the substrate 8. Since the paste P is filled into the pattern holes 12a in a state of being compressed, it is possible to secure a favorable packing property even when a mesh mask having difficulty in packing property is used as the mesh mask 12 in the screen printing.

The screen printing device is configured as above. Next, a screen printing method performed by the screen printing device will be described with reference to FIGS. 4A to 4D, FIGS. 5A to 5D, FIGS. 6A to 6C and FIGS. 7A to 7C. In this case, a direction from the left side in the drawings toward the right side thereof is designated as the squeezing direction. That is, when a pair of left and right clamp members constituting the clamp members 9 are respectively designated as clamp members 9A and 9B so as to be distinguished from each other, a direction from the clamp member 9A toward the clamp member 9B is the squeezing direction.

Figure 4A:
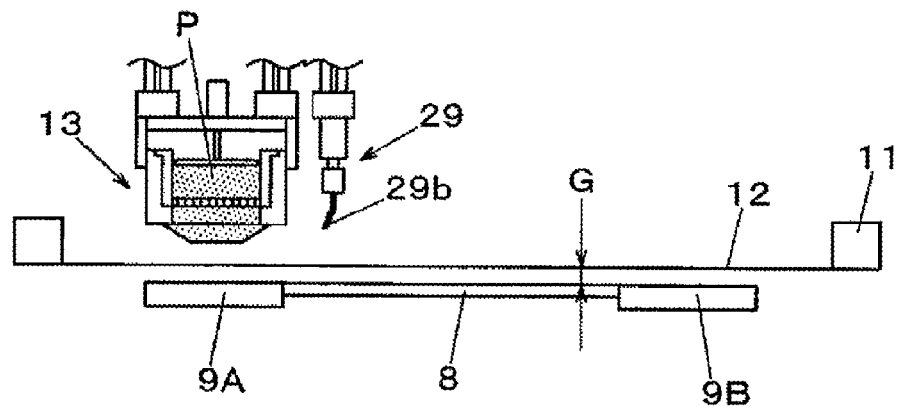
FIGS. 4A to 4D are operation explanatory views of a squeezing operation by the screen printing device according to the embodiment of the invention.

First, the substrate 8 of a printing object is transported to the substrate positioning portion 2. The substrate 8 is received and held by the substrate underlaid bracket portion 7, by driving the second Z-axis table 6B. Then, the clamp members 9A and the clamp members 9B clamp the substrate 8 from both sides thereof. Next, the substrate 8 received and held by the substrate underlaid bracket portion 7 is positioned with respect to the mesh mask 12 (a substrate positioning step). In other words, as shown in FIG. 4A, the substrate 8 is held at the position vertically separate from the lower surface of the mesh mask 12 by a predetermined gap G by moving the first Z-axis table 6A upward, while a horizontal-positioning of the substrate 8 is performed with respect to the mesh mask 12 by the substrate positioning portion 2.

Figure 4B:
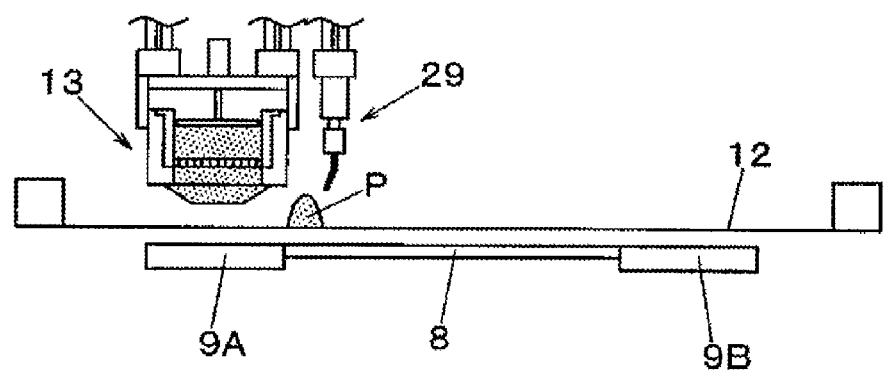

Subsequently, the paste P is supplied to the outside of the closed type squeegee mechanism 13 on the upper surface of the mesh mask 12 (a paste supplying step). That is, in the clamp member 9A side which is the starting point of squeezing, the paste P is supplied on the front side of the closed type squeegee mechanism 13, as shown in FIG. 4B. Then, a squeezing step where the closed type squeegee mechanism 13 slides on the upper surface of the mesh mask 12 is to start.

Figure 4C:
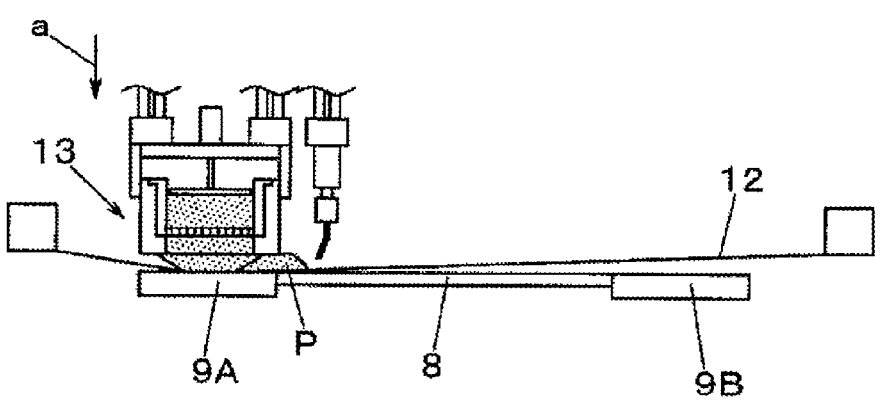
Figure 4D:
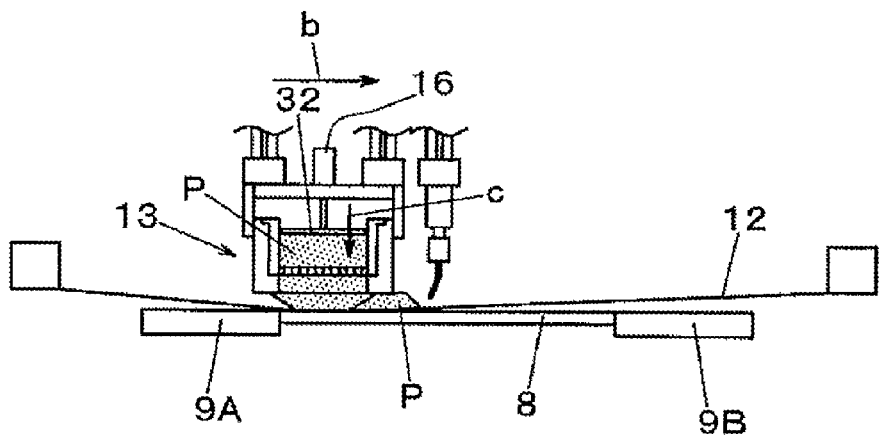

In other words, the closed type squeegee mechanism 13 is moved downward (see an arrow a) by driving the squeegee lifting mechanisms 23A and 23B, as shown in FIG. 4C so that the sliding member 34A and the sliding member 34B (see FIG. 3) are pushed to the upper surface of the mesh mask 12. Therefore, the lower surface of the mesh mask 12 abuts on the clamp members 9A as the starting point of squeezing. At this time, the paste P supplied on the mesh mask 12 is positioned at the front side of the sliding member 34B in the squeezing direction of the closed type squeegee mechanism 13. Then, as shown in FIG. 4D, the closed type squeegee mechanism 13 is moved in an outward path direction (a direction of an arrow b) by driving the Y-axis moving mechanism 21 so that the sliding member 34A and the sliding member 34B are slid on the upper surface of the mesh mask 12. At this time, the compressing plate 32 is pushed downward (see an arrow c) by the cylinder 16, whereby the paste P in the closed type squeegee mechanism 13 is compressed. Therefore, the paste P is packed into the pattern holes 12a of the mesh mask 12.

Figure 6A:
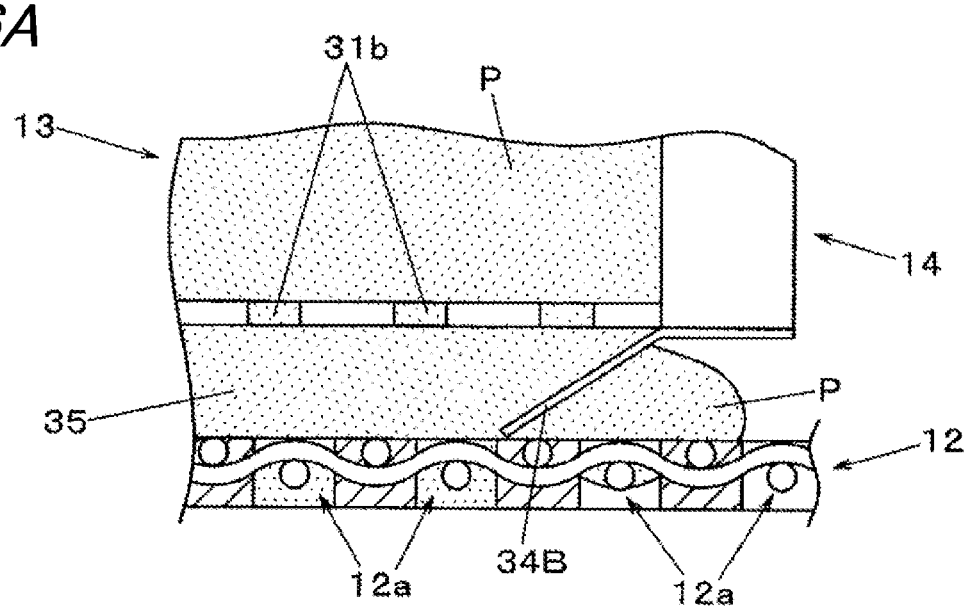
FIGS. 6A to 6C are explanatory views of packing paste, in the squeezing operation by the screen printing device according to the embodiment of the invention.

A packing operation of the paste P in the squeezing operation will be described with reference to FIGS. 6A to 6C. FIG. 6A shows a packing state of the paste P with respect to the pattern holes 12a, during the travelling of the printing portion 14 in an arrow b direction in a state where the sliding member 34A and the sliding member 34B are in a sliding-contact with the mesh mask 12. In the squeezing step, the sliding member 34B (the first sliding member) positioned on a leading side of the squeezing direction between the pair of sliding members 34A and 34B is moved in the squeezing direction before the packing of the paste P into the pattern holes 12a via the printing opening 35a between the sliding member 34A and the sliding member 34B of the printing portion 14. Therefore, the paste P supplied to the outside of the closed type squeegee mechanism 13 is packed into the pattern holes 12a.

Figure 6B:
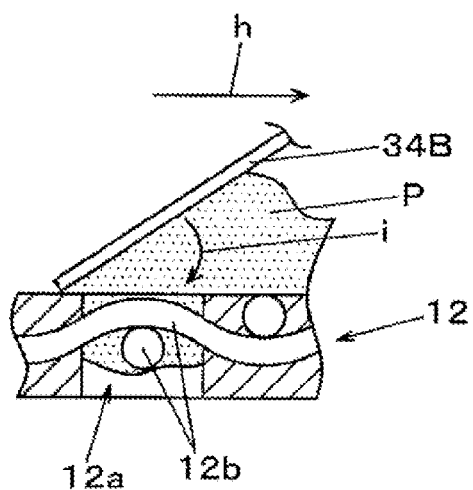
Figure 6C:
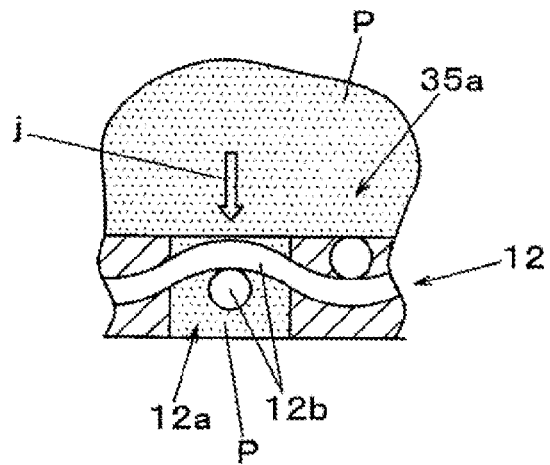

In other words, as shown in FIG. 6B, in accordance with the movement of the closed type squeegee mechanism 13, the sliding member 34B rakes the paste P which is supplied to the outside of the closed type squeegee mechanism 13, in a travelling direction (a direction of an arrow h) along the upper surface of the mesh mask 12. A flow in a rolling direction (a direction of an arrow i) is generated in the paste P by the movement of the sliding member 34B. As a result, the paste P on the mesh mask 12 is filled into the pattern holes 12a. At this time, the flow of the paste P is hindered because the mesh portion 12b is present in the pattern holes 12a. Therefore, the paste P is not completely packed into the pattern holes 12a, in this step.

Next, the closed type squeegee mechanism 13 is further moved in the squeezing direction, and therefore the pattern holes 12a is positioned under the printing opening 35a between the sliding member 34A and the sliding member 34B. In this state, the paste P in the printing space 35 is filled into the pattern holes 12a by pressure (an arrow j) generated by a pressing force of the compressing plate 32. Therefore, the paste P which is insufficiently packed into the pattern holes 12a in the squeezing step by the sliding member 34B is further filled into the pattern holes 12a. As a result, it is possible to achieve a favorable packing state even on the mesh mask 12 having the mesh portion 12b in the pattern holes 12a.

Figure 5A:
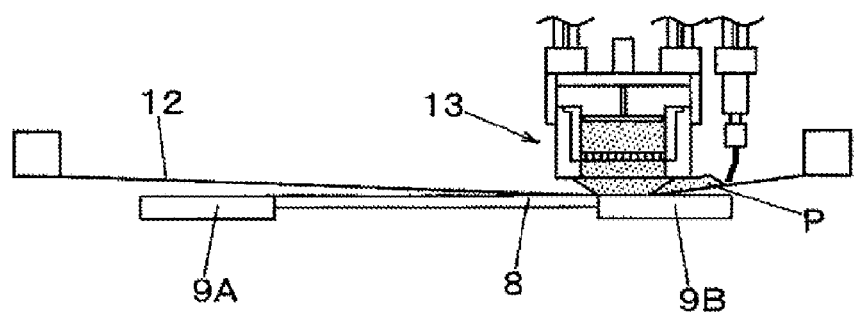
FIGS. 5A to 5D are operation explanatory views of a squeezing operation by the screen printing device according to the embodiment of the invention.

FIG. 5A shows a state where the squeezing operation with respect to all of the pattern holes 12a is completed in this manner. In this state, the closed type squeegee mechanism 13 is positioned above the clamp member 9B. Also, a remnant of the paste P which has been supplied before the squeezing operation is remained on the front side of the closed type squeegee mechanism 13 in the squeezing direction.

Figure 5B:
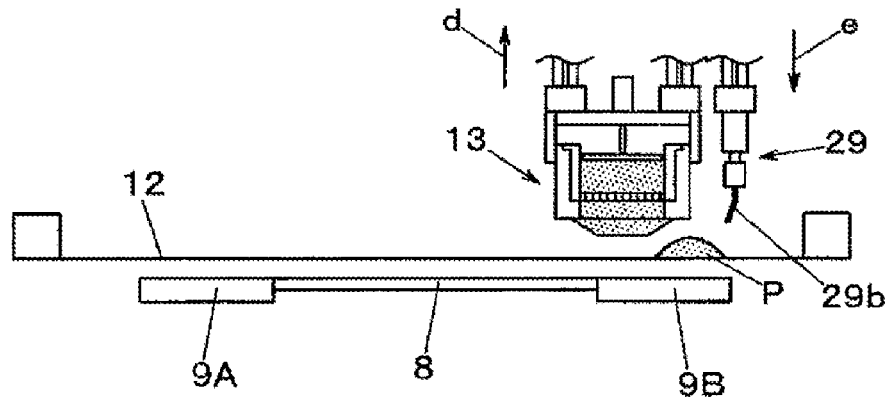
Figure 5C:
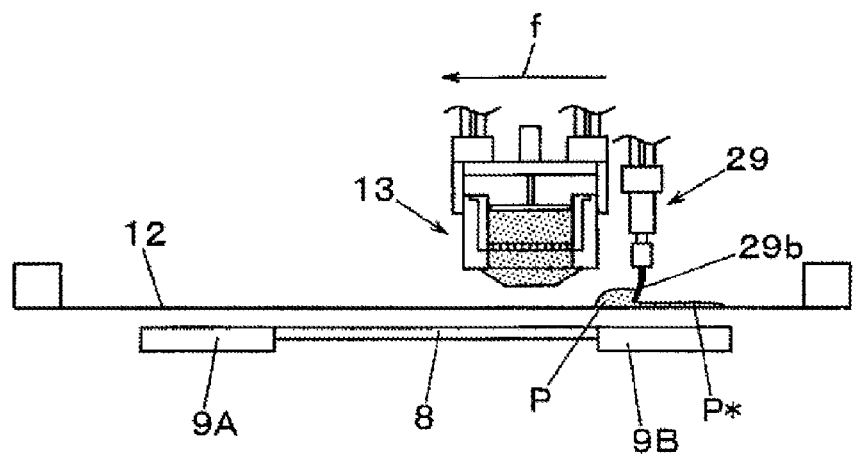
Figure 5D:
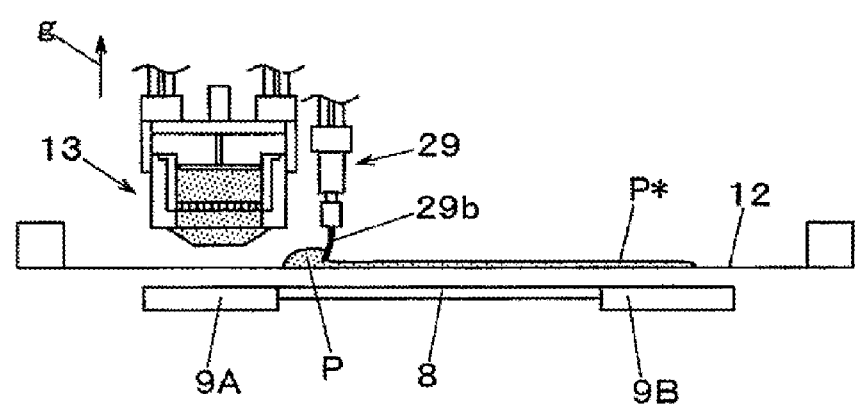

Thereafter, a returning path operation for moving the closed type squeegee mechanism 13 in a direction opposite to the squeezing direction, namely a direction from the clamp member 9B toward the clamp member 9A, is performed. In the returning path operation, the closed type squeegee mechanism 13 is returned to the starting point of squeezing and a depositing operation is performed for forming the paste film P* which covers the pattern holes 12a packed by the paste P in an outward path operation. In other words, the closed type squeegee mechanism 13 is moved upward (an arrow d) by driving the squeegee lifting mechanism 23A, 23B so as to be separated from the mesh mask 12, as shown in FIG. 5B. At the same time, the deposition member 29b of the paste deposition mechanism 29 is moved close to the upper surface of the mesh mask 12 (an arrow e). In this state, the closed type squeegee mechanism 13 and the paste deposition mechanism 29 are integrally moved in the direction opposite to the squeezing direction, namely a direction from the clamp member 9B toward the clamp member 9A (an arrow f). Therefore, the paste P supplied to the outside of the closed type squeegee mechanism 13 is spread by the deposition member 29b so that the paste film p* having a predetermined thickness is formed on the upper surface of the mesh mask 12.

Figure 7A:
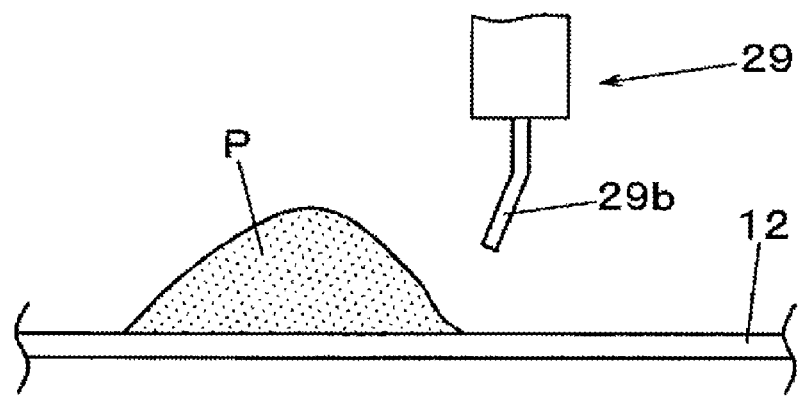
FIGS. 7A to 7C are explanatory views of paste depositing, in the squeezing operation by the screen printing device according to the embodiment of the invention.
Figure 7B:
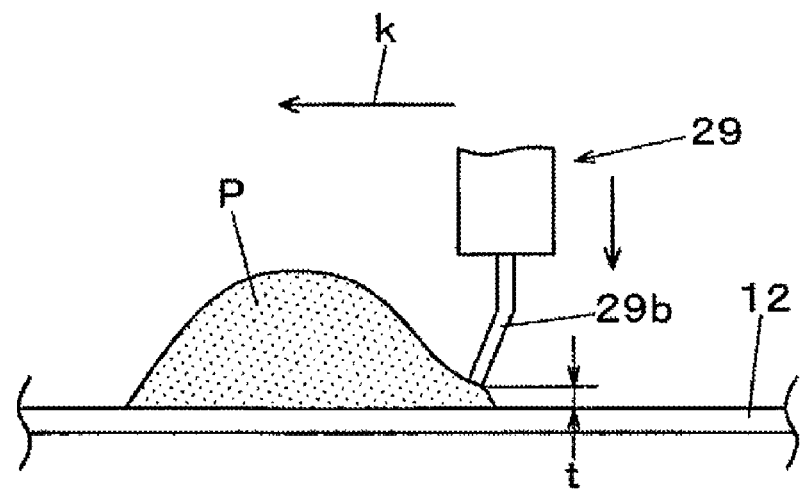
Figure 7C:
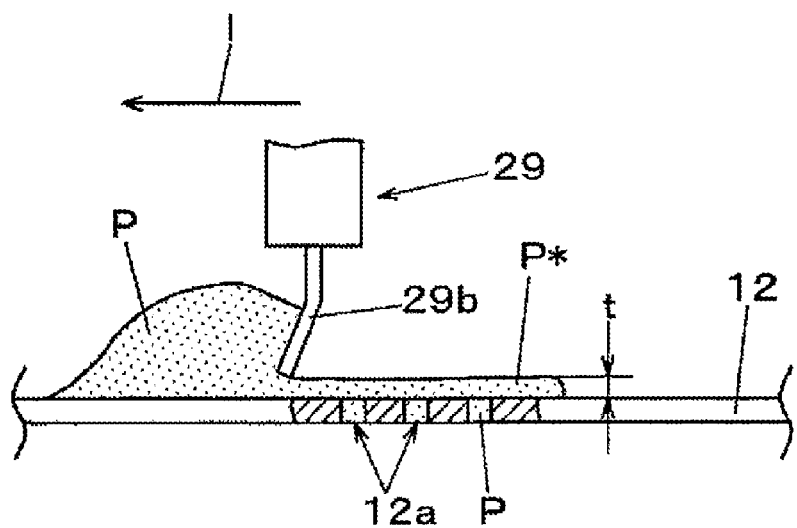

The depositing operation in the squeezing operation will be described with reference to FIGS. 7A to 7C. In FIG. 7A, the paste P is supplied on the mesh mask 12 and the deposition member 29b is located at a position separate from the mesh mask 12. Then, the process proceeds to the depositing operation. In the depositing operation, first, the deposition member 29b is moved downward so that the vertical position of the deposition member 29b is held at a position where a deposition gap corresponding to a specific paste film thickness t is held between the lower end portion of the deposition member 29b and the upper surface of the mesh mask 12. In this state, the paste deposition mechanism 29 is moved in a direction (a direction of an arrow k) opposite to the squeezing direction. Therefore, the paste P on the mesh mask 12 is spread by the deposition member 29b, whereby the paste film p* having a predetermined thickness t is formed on the upper surface of the mesh mask 12, as shown in FIG. 6C. The paste film P* covers the upper surface of the pattern holes 12a of the mesh mask 12. Therefore, it is possible to effectively prevent clogging in the pattern holes 12a, which is induced by drying and solidifying of the paste P in the pattern holes 12 when directly exposed to the air.

As described above, according to the screen printing of the embodiment, in the squeezing operation by the closed type squeegee mechanism 13 which is configured so that the paste P compressed internally is packed from the printing opening 35a between the pair of sliding member 34A and sliding member 34B before the packing of the paste P into the pattern holes 12a via the printing opening 35a, the sliding member 34B (first sliding member) positioned on the leading side of the squeezing direction between the pair of sliding member 34A and sliding member 34B moves in the squeezing direction so that the paste P supplied to the outside of the closed type squeegee mechanism 13 on the upper surface of the mesh mask 12 is packed into the pattern holes 12a.

Therefore, since the paste P is packed via the printing opening 35a, it is possible to further improve the packing property so that it is possible to secure a favorable packing property with respect to the mesh mask 12 having a high degree of difficulty in printing. Further, printing is performed on the mesh mask 12 in the manner of off-contact printing, in the example. However, the invention also can be applied to the case of off-contact printing where the squeezing is performed by causing the entire surface of the mesh mask 12 to abut on the substrate 8.

During a printing execution step, the paste film P* is formed by following procedure described below, in a returning path operation for moving the closed type squeegee mechanism 13 in the direction opposite to the squeezing direction after the outward path operation where the paste P is packed into the pattern holes 12a by moving the closed type squeegee mechanism 13 in the squeezing direction. The paste P supplied to the outside of the closed type squeegee mechanism 13 on the upper surface of the mesh mask 12 is spread due to the deposition member 29b, by moving the holder 29a of the paste deposition mechanism 29 in a state close to the upper surface of the mesh mask 12 in the direction opposite to the squeezing direction (an arrow l), and therefore the paste film P* having a predetermined thickness is formed. Thus, it is possible to cover the pattern holes 12a by the paste film P*, and therefore it is possible to prevent a printing failure caused by drying of the paste P in the pattern holes 12a.

This application is based on Japanese Patent Application No. 2011-051197 filed on Mar. 9, 2011. The entire contents thereof noted above are included in this application.

INDUSTRIAL APPLICABILITY

A screen printing device and a screen printing method of the invention have an effect capable of preventing a printing failure caused by drying of paste in pattern holes. Also, it is useful to perform solder printing using a mesh mask having a high degree of difficulty in packing.

REFERENCE SIGNS LIST

1: screen printing device
2: substrate positioning portion
7: substrate underlaid bracket portion
8: substrate
10: screen printing portion
12: mesh mask
12a: pattern hole
12b: mesh portion
13: closed type squeegee mechanism
14: printing portion
20: squeegee moving mechanism
21: Y-axis moving mechanism
29: paste deposition mechanism
29a: holder
30: main body portion
34A, 34B: sliding member
35: printing space
35a: printing opening
P: paste
P*: paste film

The invention claimed is:

1. A screen printing device for printing paste on a substrate via pattern holes by performing a squeezing operation in which a squeegee unit slides in a squeezing direction in a state of abutting on an upper surface of a mask formed with the pattern holes, comprising:
   a substrate underlaid bracket portion which receives and holds the substrate;
   a squeegee moving mechanism which causes the squeegee unit to be moved upward or downward and moved in the squeezing direction; and a paste deposition mechanism which is movable in the squeezing direction in synchronization with the squeegee unit and has a deposition member moving upward or downward with respect to the mask provided on a front side in the squeezing direction of the squeegee unit, wherein the squeegee unit is a closed type squeegee mechanism which is configured so that a pair of sliding members opposed to each other in a downward-narrowed state extend downward from a lower surface side of a main body portion storing the paste so as to align a facing direction thereof with the squeezing direction and compresses the paste stored in the main body portion and slides the sliding members in the squeezing direction in a state of being abutted on the upper surface of the mask so that the paste is packed into the pattern holes via a printing opening provided between the sliding members, wherein, in an outward path operation for moving the squeegee unit in the squeezing direction, a first sliding member positioned on a leading side of the squeezing direction between the pair of sliding members is moved in the squeezing direction before the packing of the paste into the pattern holes via the printing opening so that the paste supplied to the outside of the closed type squeegee mechanism on the upper surface of the mask is packed into the pattern holes, and wherein, in a returning path operation for moving the squeegee unit in a direction opposite to the squeezing direction after the outward path operation, the paste supplied to the outside of the closed type squeegee mechanism and remained in a state where the squeezing operation in the outward path operation is completed on the upper surface of the mask is spread due to the deposition member, by moving the deposition member in a state close to the upper surface of the mask in the direction opposite to the squeezing direction, thereby forming a paste film having a predetermined thickness.

2. A screen printing method for printing paste on a substrate via pattern holes by performing a squeezing operation in which a squeegee unit slides in a squeezing direction in a state of abutting on an upper surface of a mask formed with the pattern holes, in which the squeegee unit is a closed type squeegee mechanism which is configured so that a pair of sliding members opposed to each other in a downward-narrowed state extend downward from a lower surface side of a main body portion storing the paste so as to align a facing direction thereof with the squeezing direction and compresses the paste stored in the main body portion and slides the sliding members in the squeezing direction in a state of being abutted on the upper surface of the mask so that the paste is packed into the pattern holes via a printing opening provided between the sliding members, and further a paste deposition mechanism which is movable in the squeezing direction in synchronization with the squeegee unit and has a deposition member moving upward or downward with respect to the mask is additionally provided on a front side in the squeezing direction of the squeegee unit is provided, the method comprising:

a substrate positioning step which positions the substrate received and held by a substrate underlaid bracket portion, with respect to the mask;

a paste supplying step which supplies the paste to the outside of the closed type squeegee mechanism on the upper surface of the mask; and a printing executing step which reciprocatively slides the squeegee unit on the upper surface of the mask, wherein, in an outward path operation of the printing executing step for moving the squeegee unit in the squeezing direction, a first sliding member positioned on a leading side of the squeezing direction between the pair of sliding members is moved in the squeezing direction before the packing of the paste into the pattern holes via the printing opening so that the paste supplied to the outside of the closed type squeegee mechanism on the upper surface of the mask is packed into the pattern holes, and wherein, in a returning path operation for moving the squeegee unit in a direction opposite to the squeezing direction after the outward path operation, the paste supplied to the outside of the closed type squeegee mechanism and remained in a state where the squeezing operation in the outward path operation is completed on the upper surface of the mask is spread due to the deposition member, by moving the deposition member in a state close to the upper surface of the mask in the direction opposite to the squeezing direction, and thereby forming a paste film having a predetermined thickness.

\* \* \* \* \*